(12) United States Patent
Novac

(10) Patent No.: US 8,909,847 B2
(45) Date of Patent: Dec. 9, 2014

(54) PROCEDURE FOR ACCESSING A NON-VOLATILE WATCH MEMORY

(75) Inventor: Pinchas Novac, Neuchâtel (CH)

(73) Assignee: EM Microelectronic-Marin SA, Marin (CH)

( * ) Notice: Subject to any disclaimer, the term of this patent is extended or adjusted under 35 U.S.C. 154(b) by 1201 days.

(21) Appl. No.: 12/527,672

(22) PCT Filed: Feb. 18, 2008

(86) PCT No.: PCT/EP2008/051920
§ 371 (c)(1),
(2), (4) Date: Oct. 14, 2009

(87) PCT Pub. No.: WO2008/101890
PCT Pub. Date: Aug. 28, 2008

(65) Prior Publication Data
US 2010/0070687 A1    Mar. 18, 2010

(30) Foreign Application Priority Data
Feb. 22, 2007  (EP) .................................... 07102860

(51) Int. Cl.
*G06F 12/00*  (2006.01)
*G04D 7/00*  (2006.01)
*G11C 16/10*  (2006.01)
*G04G 21/00*  (2010.01)
*G11C 16/22*  (2006.01)

(52) U.S. Cl.
CPC ................ *G11C 16/10* (2013.01); *G04D 7/003* (2013.01); *G11C 16/102* (2013.01); *G04G 21/00* (2013.01); *G11C 16/22* (2013.01)

USPC .......................................... 711/103; 711/164

(58) Field of Classification Search
USPC .................................................. 711/103, 164
See application file for complete search history.

(56) References Cited

U.S. PATENT DOCUMENTS

| | | |
|---|---|---|
| 4,763,309 A | 8/1988 | Descombes |
| 4,771,399 A | 9/1988 | Snowden et al. |
| 5,990,659 A | 11/1999 | Frannhagen |
| 6,862,317 B1 * | 3/2005 | Mohan et al. .............. 375/238 |
| 6,913,087 B1 | 7/2005 | Brotto et al. |
| 7,065,668 B2 * | 6/2006 | Kosuda et al. .............. 713/500 |
| 7,313,664 B2 * | 12/2007 | Nunnelley ................. 711/163 |

FOREIGN PATENT DOCUMENTS

| | | |
|---|---|---|
| EP | 0 253 227 A1 | 1/1988 |
| WO | 03/017284 A1 | 2/2003 |

* cited by examiner

*Primary Examiner* — Kalpit Parikh
(74) *Attorney, Agent, or Firm* — Sughrue Mion, PLLC

(57) ABSTRACT

The invention relates to a procedure for accessing a non-volatile watch memory, the watch comprising two supply terminals accessible from the outside that define a potential difference corresponding to a standard supply voltage, and a control circuit of the non-volatile memory produced using a technology supporting a predefined maximum supply voltage, the access procedure consisting of transmitting the following to the control circuit of the non-volatile memory by means of a supply terminal of the watch: a) an opening key to authorize access to the non-volatile memory; b) an instruction for access to the non-volatile memory; the procedure being characterized in that the opening key is a predefined instruction transmitted by modulation of the standard supply voltage such that this does not exceed the predefined maximum supply voltage.

22 Claims, 3 Drawing Sheets

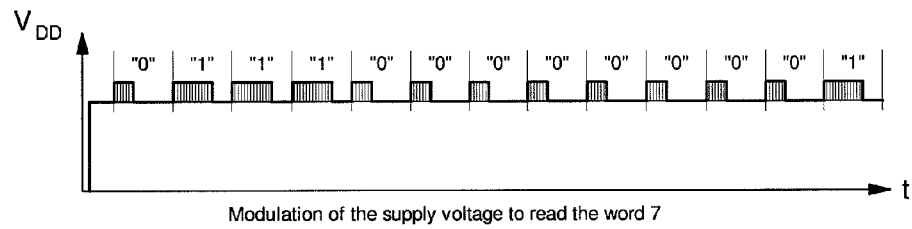
Modulation of the supply voltage to read the word 7
Fig. 3a
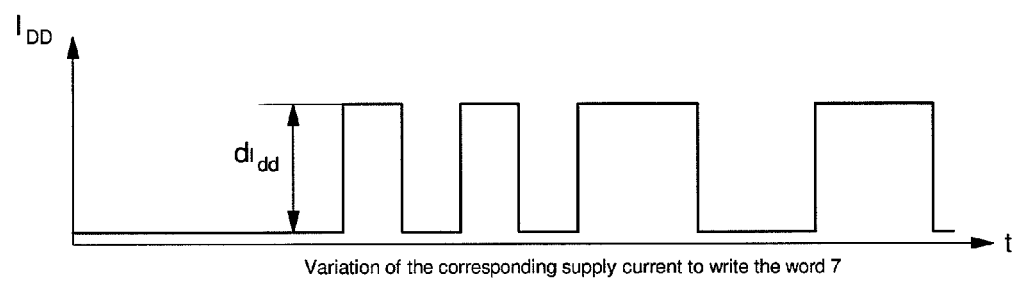
Variation of the corresponding supply current to write the word 7
Fig. 3b
Fig. 4
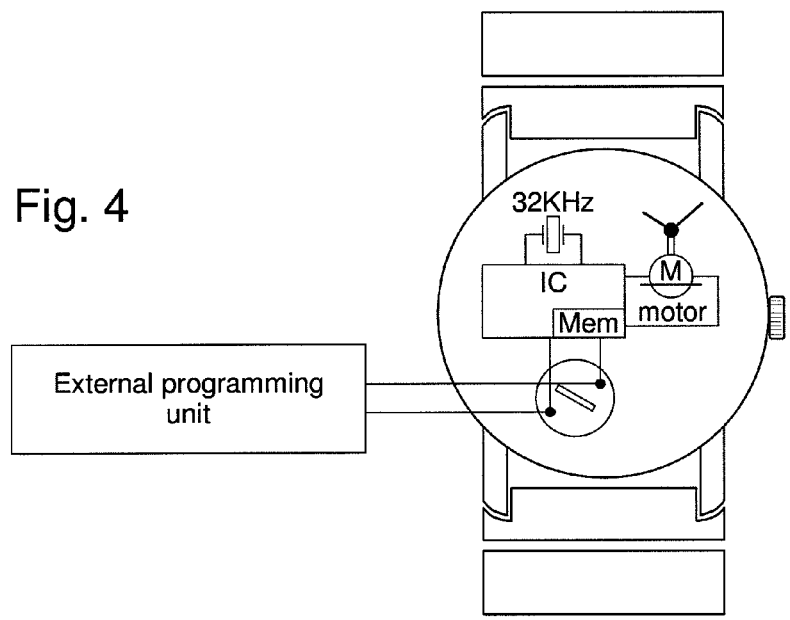

PROCEDURE FOR ACCESSING A NON-VOLATILE WATCH MEMORY

CROSS REFERENCE TO RELATED APPLICATIONS

This application is a National Stage of International Application No. PCT/EP2008/051920 filed Feb. 18, 2008, claiming priority based on European Patent Application No. 07102860.9, filed Feb. 22, 2007, the contents of all of which are incorporated herein by reference in their entirety.

TECHNICAL FIELD

In general terms, the present invention relates to a procedure for accessing a non-volatile watch memory. The watch comprises two supply terminals accessible from outside the watch that define a potential difference corresponding to a standard supply voltage. More specifically, the invention relates to the procedure for accessing the non-volatile memory by means of at least one of the supply terminals of the watch for the purpose of programming values for the proper function of the watch, for example.

TECHNOLOGICAL PRIOR ART

A method of programming a non-volatile memory for an analog watch to enable adjustment, for example, of the inhibit value for adjusting the time base frequency of the watch is known in the prior art, e.g. from document CH 664 868. The method described in this document does not require any auxiliary input and only uses the terminals of the supply battery that are accessible from the outside in this type of watch. One can see the advantage of such a system that allows values such as the operation of the watch to be controlled accurately when this has been sealed and cannot be disassembled and therefore is not subject to interferences resulting from welding of the glass, for example, or from any other production step subsequent to the adjustment.

An integrated control circuit of the non-volatile memory is incorporated into the watch in order to implement such a programming method. The programming method provides for bringing the supply voltage to an elevated voltage value by means of a voltage peak, i.e. 6.3 V, in order to authorise access to the non-volatile memory before transmitting a programming instruction by way of pulses supplied at a supply terminal that allows the content of counters to be modified until the desired value is reached before being copied again in the non-volatile memory.

While such a method is functional, it has some disadvantages. One of the constant concerns for a person skilled in the art is the miniaturisation of components of a watch in order to reduce its overall size to improve the aesthetic appeal of the unit. One of the main components where progress is regularly made is the integrated circuit incorporated into the watch. In fact, the technologies used in the production of transistors are increasingly concentrated and result in modifications of the overall performance of the integrated circuit. Thus, the finer or smaller the technology of the transistors, the lower the applicable voltages for controlling such transistors must be, otherwise there is the risk of the performance of the transistors becoming unmanageable and/or undesirable. For some transistor technologies the maximum applicable control voltage between its terminals is defined, e.g. at 3.6 volts, for a so-called "0.35µ" technology, i.e. wherein the size of a transistor amounts to 0.35 µm, and consequently the application of higher control voltages to the transistors produced using this technology causes a decrease in reliability of the transistors and therefore in the overall performance of the circuit. It is clearly evident that such uncertainty cannot be tolerated for a method for programming a non-volatile memory of a watch, in which the aim is to program the values that ensure proper function of the watch in particular by means of an integrated control circuit.

SUMMARY OF THE INVENTION

The main aim of the present invention is to develop a procedure for accessing a non-volatile watch memory, regardless of the transistor technology used in the control circuit of the memory of the watch. For this, in addition to the non-volatile memory, the watch comprises two supply terminals accessible from outside the watch that define a potential difference corresponding to a standard supply voltage, and a control circuit of the non-volatile memory produced using a technology supporting a predefined maximum supply voltage. The access procedure consists of transmitting the following to said control circuit of the non-volatile memory by means of at least one of the supply terminals of the watch:

a) an opening key to authorise access to the non-volatile memory;
b) an instruction for access to the non-volatile memory;

The access procedure is characterised in that said opening key is a predefined instruction transmitted by modulation of the standard supply voltage such that this does not exceed the predefined maximum supply voltage.

The use of such an opening key in the form of a predefined instruction ensures that the potential difference between the supply terminals always remains below the predefined maximum supply voltage, depending on the technology of the control circuit. Thus, a reduction in reliability of the circuit as a result of too high a control voltage at the transistors forming the control circuit of the non-volatile memory is prevented. Moreover, the predefined nature of the instruction serving as opening key guarantees secure access to the memory.

Advantageous embodiments are the subject of the dependent claims.

BRIEF DESCRIPTION OF THE DRAWINGS

Other features and advantages of the present invention shall become clearer after reading the following detailed description of embodiments of the invention given solely by way of non-restrictive example and illustrated by the attached drawings, wherein:

FIGS. 3a and 3b respectively show a read instruction and the corresponding current variations for reading the data;

FIG. 4 schematically shows an analog watch, on which the access procedure according to the invention is performed;

DETAILED DESCRIPTION OF THE INVENTION

The present invention now to be described is presented solely as non-restrictive example for illustration with respect to FIGS. 1 to 4.

FIG. 4 schematically shows an analog watch, which comprises a quartz resonator supplying a frequency of 32 kHz, frequency dividing means for controlling the operation of a motor for driving the hands at the desired frequency and is supplied by a battery connected to two supply terminals that are accessible from the outside, generally through the base of the watch case. A non-volatile memory is additionally provided to store information generally relating to the watch and more specifically to its proper function, and an integrated control circuit of the memory is provided to access this. The control circuit of the non-volatile memory is produced using a technology that supports a predefined maximum supply voltage. Included in the possible information that this non-volatile memory contains is, for example, the inhibit cycle and the inhibition of the quartz resonator, the duration of the drive pulses, the motor cycle, the activation or deactivation of the detection of the end of the battery life, the choice of the type of usable battery, the unique series number of the integrated circuit used etc.

To program these different items of information in the non-volatile memory of the watch, a procedure is provided for secure access after assembly of the watch so that the information that can be influenced by the assembly process such as the adjustment of the operation of the watch or motor adjustments (pulse duration, between pulses.), for example, is as reliable as possible. This procedure for accessing the non-volatile memory is conducted by transmitting instructions to the control circuit of the memory via at least one of the supply terminals of the watch. It will be noted in this regard that the two supply terminals define a potential difference corresponding to a selected standard supply voltage lower than the maximum supply voltage of the control circuit.

The transmitted instructions include at least one opening key to authorise access to the non-volatile memory and an instruction for access to the non-volatile memory subsequent to the received authorisation. According to the present invention, it is provided that the opening key is a predefined instruction transmitted by modulation of the standard supply voltage in such a way that this does not exceed the predefined maximum supply voltage of the control circuit.

Figure 1:
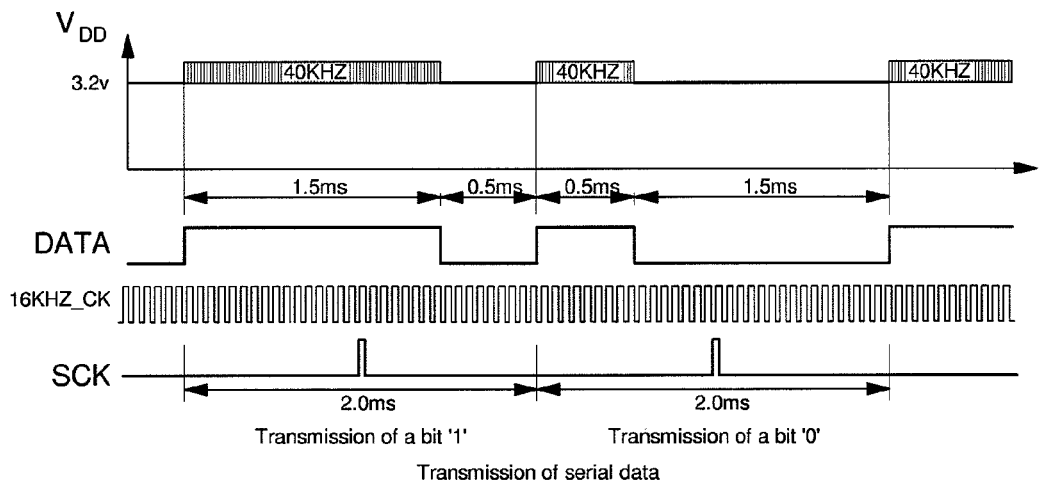
FIG. 1 shows an example of pulse width modulation used in the procedure for accessing a non-volatile watch memory according to a preferred exemplary embodiment of the invention.

FIG. 1 shows an example of pulse width modulation usable for the transmission of instructions during the procedure for accessing the non-volatile memory of the watch according to a preferred exemplary embodiment of the access procedure of the invention. The transmission of the instructions and in particular the transmission of the opening key is performed by transmitting serial data conducted via the positive supply line by a direct modulation of a carrier frequency with the data signal. In this example, the amplitude of the carrier frequency is selected such that when added to the standard supply voltage it does not exceed the predefined maximum supply voltage.

It will be noted that, as variants, it is fully conceivable to directly modulate the negative supply line or even to provide a modulation shared between the two supply lines, wherein one can serve to receive the data and the other to receive a clock signal, or also any other suitable sharing of the transmission of possible data over the control lines. It will be noted that the solution presented in FIG. 1 remains a preferred solution, and a functional diagram of the detection of the instructions transmitted via the control circuit shall be explained in association with FIG. 5.

Still as variants, it will be noted that it is possible to transmit data directly by pulse width modulation without carrier addition, although such a solution is less secure for the transmission of data. It is also possible to envisage other methods of modulation such as a method of all or nothing modulation, for example. In this regard it will be noted that the instructions transmitted by pulse width modulation or by all or nothing modulation are performed by means of pulses, the amplitude of which when added to the standard supply voltage does not exceed the predefined maximum supply voltage. In addition, it is noted that the modulation recommended in FIG. 1 as well as the variants presented above advantageously allow memories of developed capacities to be used such that the access to the memory is made directly to the desired address.

While this is also possible, it has been found, however, that a variant based on a method of pulse position modulation consisting of the successive transmission of pulses, of which the time between two pulses allows an instruction to be coded, was not suitable for use of a developed memory structure for reasons of synchronisation and ease of access to a memory address. This is why with such a modulation technique the non-volatile memories used are restricted to use of a register or some registers, in which each information bit is checked off and then written in succession.

Figure 2A:
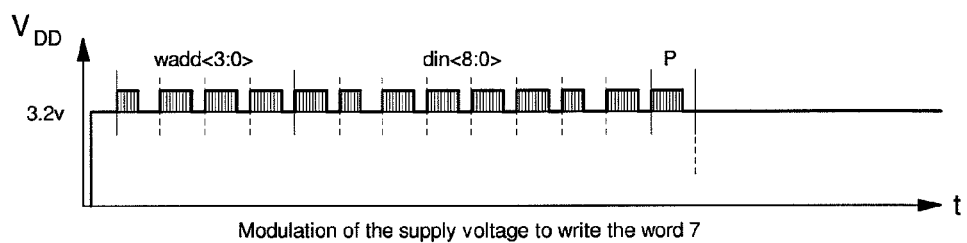
FIGS. 2a and 2b respectively show a programming instruction and the corresponding current variation for verifying the execution of the programming instruction.
Figure 2B:
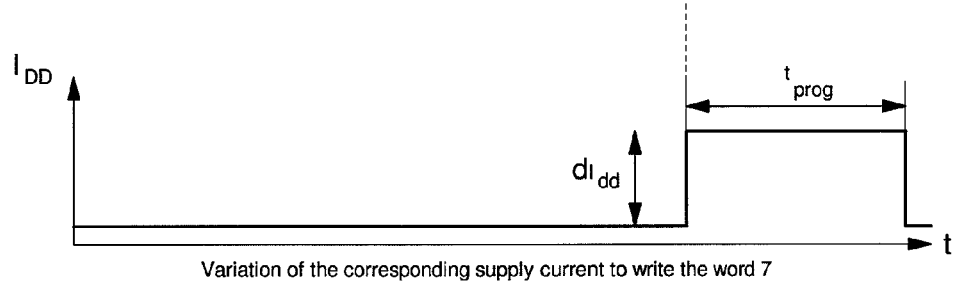

FIGS. 2a and 2b respectively show a programming instruction and the corresponding current variation to verify the execution of the programming instruction.

Within the framework of the shown example, a programming instruction comprises four first bits (wadd<3:0>), referred to as address bits since they define the address to be programmed into the memory, followed by eight data bits (din<7:0>). It will be noted that the high order bits (MSB) are defined by wadd<3> and din<7> and that the low order bits (LSB) are defined by wadd<0> and din<0>. A bit P is additionally provided to check the coding error of the incoming data bits (din) by checking parity. This bit P is called the parity bit.

It will be noted that during a programming instruction, the low order bits are written into the memory first before writing the high order bits, while during a read instruction the sequence is reversed in that the high order bits are read first and then the low order bits, as will be seen in more detail in association with FIGS. 3a and 3b.

Once the instruction has ended, i.e. once the transmission of data has ended, the supply unit of the circuit continues to supply a predefined minimum supply voltage, e.g. 2.5 V, during a likewise predetermined minimum time period, e.g. 10 ms, to authorise the actual programming of the non-volatile memory. This programming is conducted in the classic manner by means of a voltage multiplier that allows the high voltage necessary for programming memory cells to be obtained.

FIG. 2b shows the high supply current, which can be in the order of 50 to 100 µA in this example, during internal writing of the bits of the memory, i.e. during the predetermined time period ($t_{WRITE}$), which serves to confirm conformity of the transmitted data.

As has already been mentioned above in the description, the procedure for accessing the memory includes an opening key and, more generally, a start-up sequence that we will explain in detail.

Advantageously, before the transmission of the opening key a preliminary step is provided to increase the security of access to the memory. This preliminary step consists of a watch identification procedure (WIP), which allows correct activation of the access interface after the watch is placed under voltage. This watch identification procedure consists of writing a predefined address, e.g. address 10, with a predefined data item, e.g. 0, without any need for access authorisation.

Then, to truly begin the procedure for accessing the memory, it is necessary to transmit the opening key to authorise access to the memory. Advantageously, this opening key is a programming instruction that includes a predetermined address to be programmed and predetermined data bits. According to an advantageous variant, the opening key consists of supplying an address reserved for this purpose, e.g. address 9, and writing to this address a word representing the core of the opening key or a known code containing only 7 data bits (din<7:1>), e.g. the code of the selected opening key could be 1010101, the last data bit (din<0>) being reserved as authorisation bit for access to the memory in order to authorise access either by writing, i.e. by programming, or by reading in accordance with the value of this bit. The opening key will then include the parity bit for checking. Once the lock is open, the words can be programmed or read in accordance with the authorised access as many times as necessary.

We will now provide an example of an access procedure for programming the memory, said example being given in the following table and its programming instruction being represented in FIG. 2a.

| STEP | ADDRESS Wadd<3:0> | INCOMING DATA Din<7:0> | PARITY P | COMMENTS |
|---|---|---|---|---|
| Prelim. | 1010 | 00000000 | 0 | WIP |
| 1 | 1001 | 10101011 | 1 | Opening key 1010101 + select write |
| 2 | 0111 | 10101101 | 0 | Programming of inhibit period 2 mins, 45 ppm |
| 3 | 0101 | 00000110 | 0 | Programming of step of motor 2x1s, ... |
| 4 | 1001 | 00000000 | 0 | Closure key |

As is evident from above, the (optional) preliminary step or watch identification procedure consists of programming the address 10 with the word 0. The first step or opening key then consists of writing the word "1010101" to address 9 and indicating that access by writing, i.e. by programming, is authorised by the last data bit at 1. Two examples (steps 2 and 3) of programming instructions are then provided that consist of programming the inhibit period and the step of the motor respectively at addresses 7 and 5 provided for this purpose. Then, a last step (4) is advantageously provided that consists of transmitting a closure key by means of a programming instruction of the same address as the opening key, i.e. in this example address 9, by a predefined word, typically 0, to reset the data of the address to zero with a view to a subsequent procedure for accessing the memory, forbidding all subsequent access to the memory before this.

At the same time as this memory access procedure is proceeding, it is provided to compare the duration of the access procedure with a predefined timeout value and to interrupt the access procedure when it takes longer than the timeout value. This timeout value is preferably calculated from the setting under voltage.

Referring now to FIGS. 3a and 3b, we will describe an example of access procedure by reading. This Figure shows a read instruction (FIG. 3a) by modulating the supply voltage to read the word contained in the memory at address 7 ("0111") by observation of the corresponding variation of the supply current (FIG. 3b). The sequence is reversed with the high order bits (MSB) first and then the low order bits (LSB).

The data stored in the non-volatile memory are verified or read bit by bit by measuring the supply current. For this, the word to be read is selected with the address (wadd<3:0>) of this word, while each bit in the word is selected by means of an address bit (badd<2:0>). As in the case of a write instruction, the chain of data of a read instruction consists of 13 serial data bits in the example shown in FIG. 3a. The address of the bit in the word for a reading operation will be generated by a bit address decoder, which has the output of the data bit counter as input. This means that each time a new bit of the incoming data (din<7:0>) will be shifted to check off the following bit, from the first high order bit (MSB) to the last low order bit (LSB). Advantageously, the bit shifted through the shift register is a "0" bit so that the standard supply voltage is stable, i.e. is not modulated, during reading of the corresponding bit to be read.

The actual reading is performed by observing the consumption current at a supply terminal as shown in FIG. 3b. If the cell or the addressed memory word contains a "1", a current sink ISINK will be connected between the supply terminals (VDD and VSS), which substantially increases the supply current so that it can be readily detected whether the read bit is a "1" or a "0" by observing this current consumption. After the last bit to be read has been checked off, an additional bit is shifted and the control circuit then transmits the parity bit of the read word.

An example of the access procedure by reading is given in the following table:

| ADDRESS Wadd<3:0> | INCOMING DATA Din<7:0> | PARITY P | OUTGOING DATA Dout<7:0> + P | COMMENTS |
|---|---|---|---|---|
| 1010 | 00000000 | 0 | | WIP |
| 1001 | 10101010 | 0 | | Opening key 1010101 + select read |
| 0111 | 10101101 | 1 | 10101101 + 1 | Reading of inhibit period 2 mins, 45 ppm |
| 0101 | 00000110 | 0 | 00000110 + 0 | Reading of step of motor 2x1s, ... |
| 1001 | 00000000 | 0 | | Closure key |

As in the case of the access procedure for conducting programming operations described above, a preliminary watch identification step is advantageously provided in the same manner for the access procedure for conducting reading operations, followed by a first step including the opening key, in which the last data bit (din<7:0>), "0" in this example, enables indication that the requested and authorised access is an access for reading. The two following steps are two examples of instructions for reading data previously written using the protocol defined in FIGS. 3a and 3b. The transmission of a closure key is then found to terminate this access procedure forbidding all subsequent unauthorised access to the memory.

It will be noted that with this procedure authorising access to the memory for programming, or for reading, only after receipt of a known opening key and advantageously a watch identification procedure and a closure key, the procedure by writing and/or reading described above allows favourable immunity from parasitic signals capable of being received to access the memory fraudulently or by error.

Figure 5:
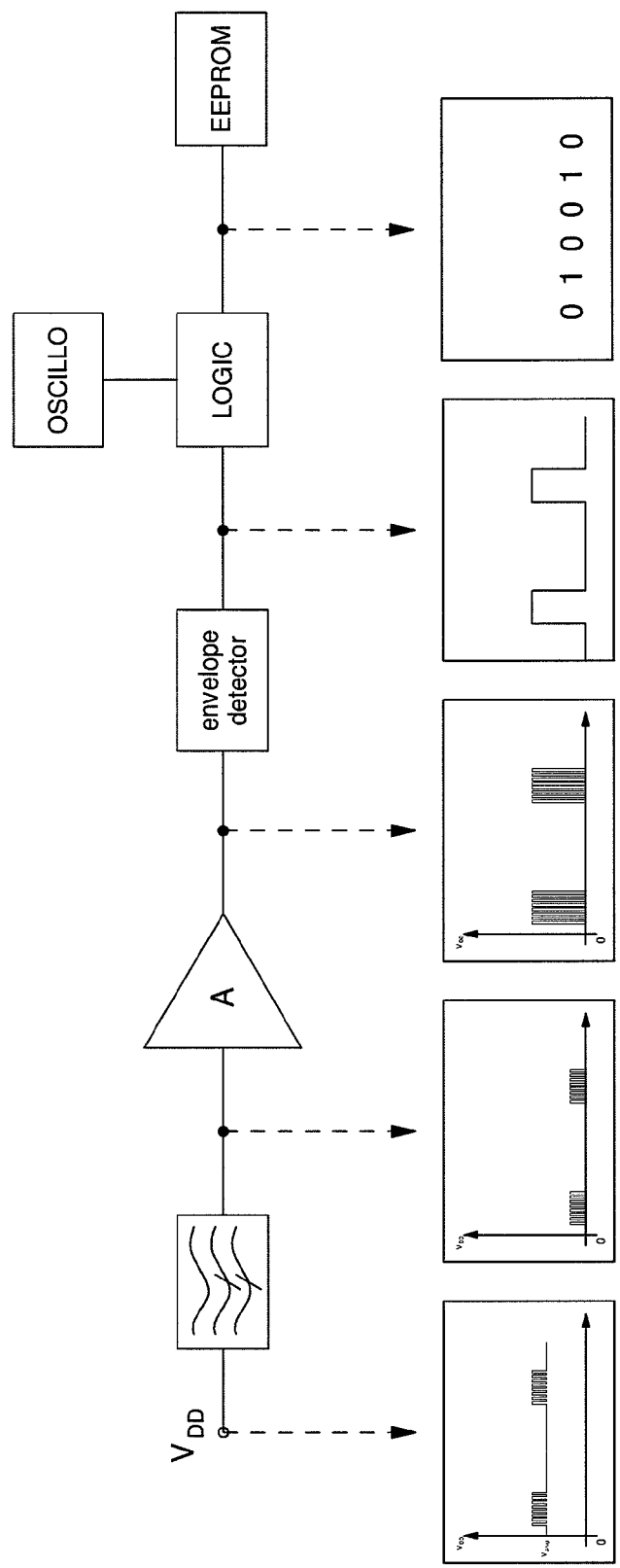
FIG. 5 schematically shows a control circuit of the non-volatile memory incorporated into a watch.

FIG. 5 schematically shows a control circuit of the non-volatile memory incorporated into a watch according to the practical example proposed above. The control circuit classically includes a high-pass filter that allows only the high frequency carrier signal of the useful information, i.e. the programming and/or reading instructions for the memory, to be retained, followed by an amplifier to increase the amplitude of the useful signal, then an envelope detector to dissociate the carrier from the transmitted information bits, and then a digital processing operation to convert the information bits received into a sequence of "1" and "0" to enable the instructions to be decoded.

It has been found that the use of the quartz oscillator of the watch to set the rate of operations at the level of the integrated control circuit in the watch had a start-up time (in the order of 0.5 to 2 s) or actuation time that appreciably slows down the total programming time of a watch. This is why it is advantageously provided that the control circuit uses a simple oscillator, an RC type oscillator, as clock signal generator during the programming procedure to allow a start-up (in the order of some µs) that is significantly quicker than when using the quartz oscillator of the watch.

It will be understood that various modifications and/or improvements and/or combinations obvious to a person skilled in the art can be applied to the different embodiments of the invention outlined above without departing from the framework of the invention defined by the attached claims. In particular, it will be noted that this access procedure can equally be applied advantageously to volatile registers generally used during clock tests to verify the correct operation of the watch.

The invention claimed is:

1. An access procedure for programming a non-volatile watch memory, said watch comprising two supply terminals accessible from outside the watch that define a potential difference corresponding to a standard supply voltage, and a control circuit of the non-volatile memory produced using a technology supporting a predefined maximum supply voltage, said access procedure including transmitting the following to said control circuit of the non-volatile memory by means of at least one of the supply terminals of the watch:
   a) an opening key to authorise access for programming the non-volatile memory;
   b) an instruction for access for programming the non-volatile memory;
   wherein said opening key is a predefined instruction transmitted by modulation of said standard supply voltage such that this does not exceed said predefined maximum supply voltage, and that said supply voltage is not increased to authorise the programming of the cells of the non-volatile memory.

2. The access procedure according to claim 1, wherein the control circuit uses an RC oscillator as clock signal generator during the programming procedure.

3. The access procedure according to claim 1, wherein the instructions are transmitted by pulse width modulation with respect to pulses, in which the amplitude added to the standard supply voltage does not exceed the predefined maximum supply voltage.

4. The access procedure according to claim 1, wherein the access instructions comprise programming instructions comprising address bits, which define an address to be programmed into the memory, and data bits to be programmed to the address defined by the address bit contained in the programming instruction.

5. The access procedure according to claim 3, wherein the opening key is a programming instruction comprising a predetermined address to be programmed and predetermined data bits.

6. The access procedure according to claim 4, wherein the opening key additionally comprises at least one authorisation bit for access to the memory by programming or reading.

7. The access procedure according to claim 1, wherein the instructions are transmitted by means of a carrier, of which the amplitude added to the standard supply voltage does not exceed the predefined maximum supply voltage of said technology.

8. The access procedure according to claim 1, wherein a preliminary watch identification step is provided, which consists of a programming instruction for a predetermined address by means of predetermined data bits not requiring access authorisation.

9. The access procedure according to claim 1, wherein a closure key is provided, which consists of executing a predetermined instruction forbidding all subsequent unauthorised access to the memory.

10. The access procedure according to claim 9, wherein the closure key is a programming instruction for the address determined in the opening key by different determined data bits from those programmed during execution of the opening key.

11. The access procedure according to claim 1, wherein it is provided to compare the duration of the access procedure with a predefined timeout value and to interrupt the access procedure when it takes longer than the timeout value.

12. A procedure for reading a non-volatile watch memory, said watch comprising two supply terminals accessible from outside the watch that define a potential difference corresponding to a standard supply voltage, and a control circuit of the non-volatile memory produced using a technology supporting a predefined maximum supply voltage, said access procedure including transmitting the following to said control circuit of the non-volatile memory by means of at least one of the supply terminals of the watch:
   a) an opening key to authorise access for reading the non-volatile memory;
   b) an instruction for access for reading the non-volatile memory;
   wherein said opening key is a predefined instruction transmitted by modulation of said standard supply voltage such that this does not exceed said predefined maximum supply voltage, and that said supply voltage is not increased to authorise the reading of the cells of the non-volatile memory.

13. The access procedure according to claim 12, wherein the access instructions comprise read instructions comprising address bits, which define an address to be read in the memory, and data bits to successively read each of the data bits of the address defined by the address bits contained in the read instruction.

14. The access procedure according to claim 13, wherein the data bits of a read instruction are determined such that the standard supply voltage is not modulated during the actual reading of each bit of the address to be read.

15. The access procedure according to claim 12, wherein the instructions are transmitted by pulse width modulation with respect to pulses, in which the amplitude added to the standard supply voltage does not exceed the predefined maximum supply voltage.

16. The access procedure according to claim 15, wherein the opening key is a programming instruction comprising a predetermined address to be programmed and predetermined data bits.

17. The access procedure according to claim 13, wherein the opening key additionally comprises at least one authorisation bit for access to the memory by reading.

18. The access procedure according to claim 12, wherein the instructions are transmitted by means of a carrier, of which the amplitude added to the standard supply voltage does not exceed the predefined maximum supply voltage of said technology.

19. The access procedure according to claim 12, wherein a preliminary watch identification step is provided, which consists of a programming instruction for a predetermined address by means of predetermined data bits not requiring access authorisation.

20. The access procedure according to claim 12, wherein a closure key is provided, which consists of executing a predetermined instruction forbidding all subsequent unauthorised access to the memory.

21. The access procedure according to claim 20, wherein the closure key is a programming instruction for the address determined in the opening key by different determined data bits from those programmed during execution of the opening key.

22. The access procedure according to claim 12, wherein it is provided to compare the duration of the access procedure with a predefined timeout value and to interrupt the access procedure when it takes longer than the timeout value.

* * * * *